United States Patent
Whikehart et al.

(10) Patent No.: US 6,178,211 B1
(45) Date of Patent: Jan. 23, 2001

(54) DIGITAL PROCESSING RADIO RECEIVER WITH ADAPTIVE BANDWIDTH CONTROL

(75) Inventors: J. William Whikehart, Novi, MI (US); Christopher John Hagan, Colorado Springs, CO (US); John William Wagner, Ann Arbor, MI (US); Nicholas Lawrence Difiore, Farmington Hills, MI (US); John Elliott Whitecar, Plymouth, MI (US); James Alfred Wargnier, Chesterfield, MI (US)

(73) Assignee: Visteon Global Technologies, Inc., Dearborn, MI (US)

( * ) Notice: Under 35 U.S.C. 154(b), the term of this patent shall be extended for 0 days.

(21) Appl. No.: 09/425,550

(22) Filed: Oct. 22, 1999

Related U.S. Application Data

(63) Continuation-in-part of application No. 08/883,692, filed on Jun. 27, 1997.

(51) Int. Cl.[7] .................................................... H04B 14/06
(52) U.S. Cl. .......................................... 375/350; 455/296
(58) Field of Search .................................. 375/350, 323, 375/345, 346; 708/300, 322, 323; 455/296

(56) References Cited

U.S. PATENT DOCUMENTS

| | | | |
|---|---|---|---|
| 5,036,527 | * | 7/1991 | Halim et al. .......................... 375/345 |
| 5,339,455 | * | 8/1994 | Vogt et al. .............................. 455/266 |
| 5,777,911 | * | 7/1998 | Sherry et al. .......................... 708/316 |

OTHER PUBLICATIONS

Simon Haykin, "Introduction to Analog and Digital Communications", 1989, pp. 281–283.*

* cited by examiner

*Primary Examiner*—Don N. Vo
*Assistant Examiner*—Phuong Phu
(74) *Attorney, Agent, or Firm*—Mark L. Mollon

(57) ABSTRACT

A carrier-based signal is received from a tuner and is digitized to produce a digital intermediate frequency (IF) signal. Automatic gain control is applied to the carrier-based signal either prior to or after digitization. An adaptive intermediate frequency bandwidth control system detects IF signal level after channel filtering. The level is compared to a predetermined threshold having a value related to the known signal level of the AGC'ed signal which is being input to the channel filter in order to provide a measure of either 1) the presence of interfering adjacent channels, or 2) reception or a weak signal which can't be compensated for by AGC. The IF bandwidth is narrowed in either circumstance. Digital FIR or IIR filtering is used. The invention allows bandwidth switching to be done very quickly with minimal transient effects. A threshold value is selected depending upon the IF channel bandwidth being used at any given time.

3 Claims, 4 Drawing Sheets

DIGITAL PROCESSING RADIO RECEIVER WITH ADAPTIVE BANDWIDTH CONTROL

This application is a continuation-in-part of U.S. Ser. No. 08/883,692, filed Jun. 27, 1997.

BACKGROUND OF THE INVENTION

The present invention relates in general to a digital signal processing radio receiver wherein an intermediate frequency signal is digitally processed, and more specifically, to filtering the intermediate frequency signal with a filter bandwidth which is adaptively controlled in response to the strength of adjacent or alternate channel interferers relative to the strength of the desired channel.

Commercial AM and FM broadcast bands include a plurality of evenly spaced channels. A particular broadcast station is allocated a unique channel to conduct broadcasting within an assigned frequency range.

The power spectrum of a broadcast transmission consists of the strength of RF signals irradiating a receiving antenna over a range of frequencies. Even though most energy in a transmission can be limited to its assigned channel, efficient use of all channels implies that some radiated energy will be at frequencies outside their assigned channels. Assignment of frequency channels to individual transmitters is determined according to geographic location and other factors to minimize interference between transmissions in adjacent channels and alternate channels (an alternate channel is a channel two channels away from the desired channel of interest). Since demand in populous areas is high for the limited number of channels available, adjacent and/or alternate channel interferers are often present. Therefore, radio receivers must be able to perform adequately in situations where a strong signal on an adjacent or alternate channel creates signal components in the desired channel which interfere with reception of the desired signal. In addition, channels even farther away than an alternate channel and even sources not associated with the broadcast band can become significant interferers.

Prior art radio receivers are known which detect the presence of adjacent channel or other interference in various ways and which attempt to reduce effects of the interference by narrowing the receiver bandwidth (or by shifting the receiver passband for the desired channel). Separate filters or returning of the receiver are typical methods for detecting presence of an interfering channel. The prior art passband switching introduces transient effects which can be heard as noise. Furthermore, analog filtering that has been used does not provide sharp band edges (i.e., they have slow roll-off), so that not all of an interferer is removed.

With the advent of high speed digital signal processing (DSP) components, radio receivers are being introduced using DSP processors to implement demodulation and various other functions in a radio receiver. In particular, it is becoming possible to digitally process the intermediate frequency (IF) signal or even the radio frequency (RF) signal, thus avoiding a large number of analog circuits and components with their associated costs and space requirements. In order to keep costs down for a particular radio receiver, DSP performance in terms of 1) chip area required for processing, and 2) execution time need to be minimized.

SUMMARY OF THE INVENTION

The present invention has the advantage of adaptively filtering an intermediate frequency signal in response to the presence of adjacent channel interference while using digital signal processing in an efficient manner.

In one aspect of the invention, a radio reception circuit uses digital signal processing to digitally process an intermediate frequency (IF) signal. Circuit means provides a carrier-based signal (which in a preferred embodiment includes an analog tuner and an analog-to-digital converter generating a digitized IF signal). The circuit means applies automatic gain control to the carrier-based signal (either prior to or after A/D conversion) in order to provide a predetermined signal level. A complex mixer is coupled to the circuit means and generates a complex I & Q signal in response to the carrier-based signal. A filter processor generates a filtered I & Q signal in response to the complex I & Q signal, the filter processor having an impulse response determined by filter coefficients loaded into the filter processor. The filter coefficients are switchable between a first bank of filter coefficients for a first bandwidth and a second bank of filter coefficients for a second bandwidth narrower than said first bandwidth. A post-filter level detector is responsive to the filtered I & Q signal to generate a first level signal. A compare block is coupled to the post-filter level detector and the filter processor for selecting one of the banks of filter coefficients in response to a comparison of the first signal level and a predetermined threshold.

DETAILED DESCRIPTION OF PREFERRED EMBODIMENTS

Figure 1:
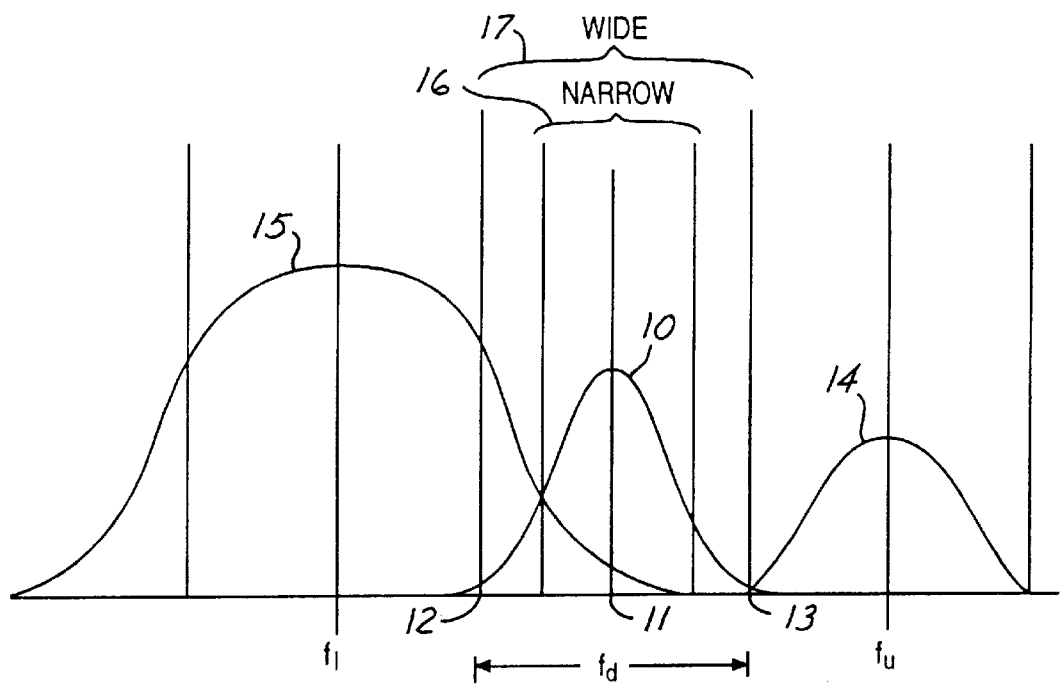
FIG. 1 plots reception field strength in a local reception area in which adjacent channel interference exists for a desired channel of interest.

FIG. 1 shows the frequency spectrum 10 of a desired radio broadcast having a center frequency 11 and occupying an assigned channel $f_d$ between a lower frequency 12 and an upper frequency 13. The upper adjacent channel $f_u$ is shown containing a broadcast signal 14 with substantially no excess signal content in the desired frequency channel, whereby the upper adjacent channel is not causing interference. However, the lower adjacent channel at $f_1$ is shown to include a radio broadcast having a frequency spectrum 15 including significant signal content above the lower frequency 12 of the desired channel. The resulting interference degrades reception of the desired radio broadcast.

Adjacent channel interference can be reduced by means of narrowing the passband of a bandwidth filter in the receiver to reduce the signal content from the adjacent channel propagating through the receiver. Thus, FIG. 1 shows a narrow bandwidth 16 which can be switched into the intermediate signal path to alleviate adjacent channel interference. When no adjacent channel interference is present, a wide bandwidth 17 is used in order to maximize quality of the received desired signal.

Figure 2:
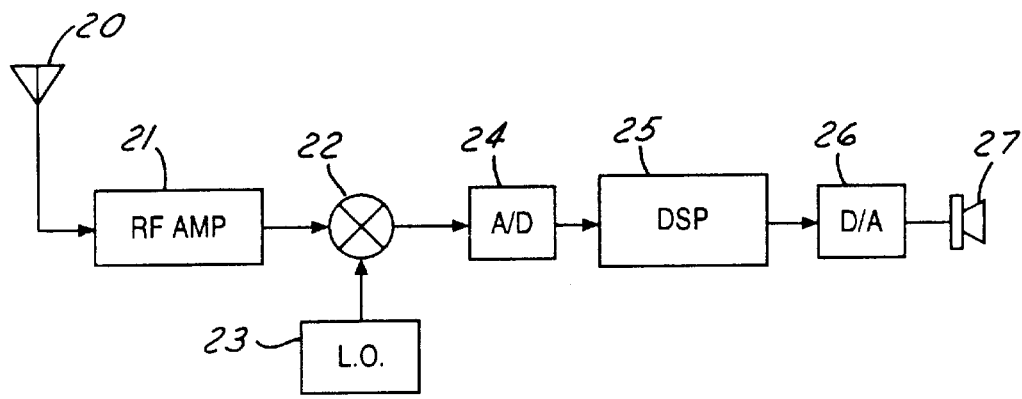
FIG. 2 is a block diagram showing portions of a DSP radio receiver.

FIG. 2 is a block diagram showing a radio receiver using digital signal processing. An antenna 20 receives broadcast RF signals which are coupled to an RF amplifier 21. Amplified RF signals are provided to one input of a mixer 22. A local oscillator 23 provides a mixing signal to a second input of mixer 22, the mixing signal having a frequency under control of a tuning control circuit (not shown). A carrier-based signal in the form of an intermediate frequency (IF) signal having a lower frequency than the original broadcast frequency is provided from mixer 22 to the input of an analog-to-digital (A/D) converter 24. RF amplifier 21 and mixer 22 constitute a tuner front end which preferably includes automatic gain control as is conventionally used in the art. The resulting carrier-based signal which is provided to A/D converter 24 thus has a predetermined signal level or power. In this way, the dynamic range of the analog IF signal is matched to the range of A/D converter 24. Alternatively, if the dynamic range of A/D converter 24 is large enough to handle the tuner output range without AGC, then the AGC function could be performed on the digital signal from A/D converter 24. Any noise contribution from A/D converter 24 could thus be somewhat corrected by the AGC function.

A digitized IF signal from A/D converter 24 is provided to digital signal processor (DSP) block 25 for filtering, demodulating, and other further processing of the resulting audio signal. A final audio signal is output from DSP 25 to the input of a digital-to-analog (D/A) converter 26 which provides analog audio signals to a speaker system 27.

DSP technology can be used to create a radio receiver having reduced cost and size, and having improved performance. In addition, new features and techniques can be easily added in DSP.

Figure 3:
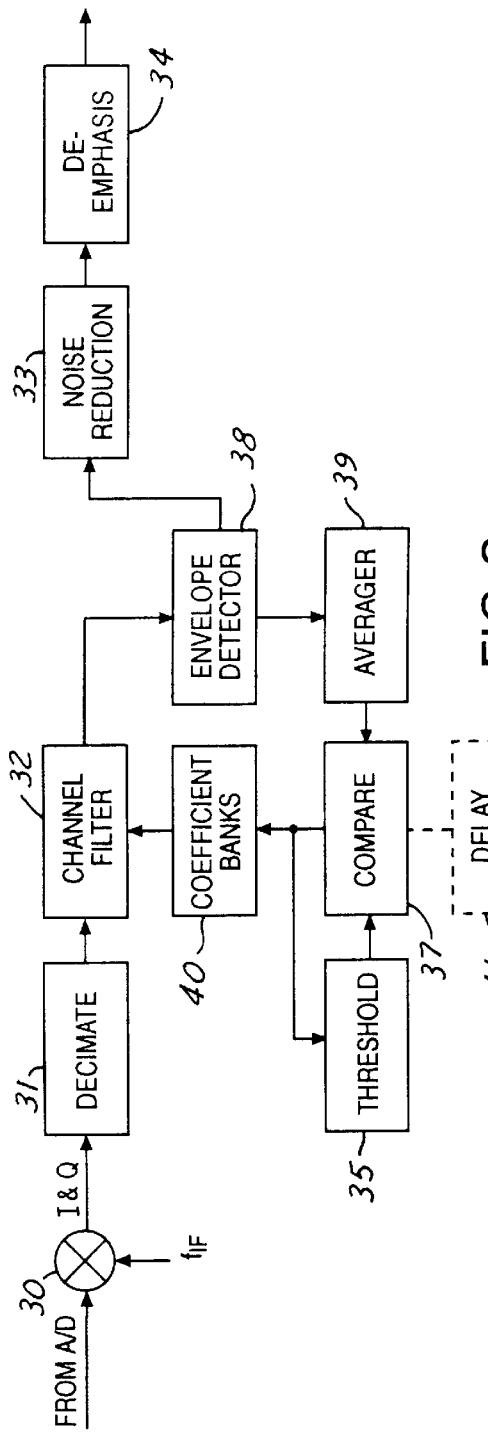
FIG. 3 is a block diagram showing DSP processing of an AM intermediate frequency signal in the manner of the present invention.

Processing of the digitized IF signal in DSP block 25 is shown in greater detail in FIG. 3. This embodiment is particularly adapted for receiving AM signals. The digitized IF signal is provided to one input of a mixer 30 which receives a mixing signal $f_{IF}$ at a second input. Mixer 30 is preferably a complex mixer and produces in-phase (I) and quadrature-phase (Q) signals. The frequency of injection signal $f_{IF}$ is nominally equal to the intermediate frequency from the A/D converter, such that the IF signal is mixed to a new IF frequency of approximately zero Hertz. Other non-zero IF frequencies or non-complex signal representations can also be used in DSP with the present invention. However, a zero-IF complex representation has many advantages in DSP processing such as compact code size, minimized chip area, and efficient data manipulation.

The complex I and Q signals are provided to a decimate block 31 which provides sample-reduced signals to the input of a channel filter 32. Channel filter 32 rejects signals outside the frequency band of interest and the bandwidth-limited signals are provided to an envelope detector 38. Envelope detection can be obtained as the square root of the sum of the squares of I and Q. An envelope detected signal is provided to a noise reduction block 33 and a de-emphasis block 34. Noise reduction block 33 operates dynamically according to frequency content of a signal and the relative amount of noise detected. De-emphasis block 34 provides compatibility with AMAX broadcasts.

Channel filter 32 is preferably implemented as a filter processor within DSP and has a switchable bandwidth according to switched filter coefficient banks from block 40.

The remaining components shown in FIG. 3 detect the presence of adjacent channel interferers and control the channel filter bandwidth accordingly. Since the analog tuner at the receiver front end applies automatic gain control to the intermediate frequency carrier-based signal, the signal level at the input of channel filter 32 is substantially constant at a known level (except when weak signal conditions are present). A predetermined threshold 35 is coupled to one input of a compare block 37 which represents a predetermined percentage of the known signal level of the AGC signal.

The output of envelope detector 38 is coupled to an averager 39 to provide a post-channel filter level detection signal to another input of compare block 37. Thus, a fixed level corresponding to the AGC signal strength is compared to the output of a level detector downstream of channel filter 32. The difference in levels is indicative of how much signal content from outside the desired channel is being filtered out by channel filter 32. The greater the signal content being filtered out, the greater the likelihood that there is an adjacent channel interferer. Thus, by comparing these two level signals in compare block 37, adjacent channel interference is detected and appropriate filter coefficient banks are selected from block 40 for loading in channel filter 32 to provide either narrowband or wideband filtering.

By employing automatic gain control for the carrier-based signal prior to filtering in channel filter 32, the signal level entering channel filter 32 is automatically known and does not have to be measured as in prior application Ser. No. 08/883,692. Thus, hardware requirements, software requirements, and cost are further improved using the present invention.

Under weak signal conditions (with no adjacent or alternate interferers present), the tuner may run out of gain and the carrier-based signal may drop out of AGC. In that case, the signal level at the input to the channel filter drops (contrary to the earlier assumption). Consequently, the post-filter level drops and when compared to the fixed threshold, may cause the channel filter to switch to narrowband filtering even though no interferers are present. This, however, is a good result because switching to the narrow bandwidth for weak signals will remove more noise than signal, thus improving the overall signal-to-noise ratio. The reason why more noise is removed is that for both AM and FM signals, the modulated signal content tends to have more of its energy nearer to the center carrier frequency while the noise is spectrally uniform. Thus, the present invention provides both reduction of adjacent and alternate channel interference and improvement in signal-to-noise ratio for weak signals.

When channel filter 32 is in its wideband mode, compare block 37 utilizes a first value for predetermined threshold 35 for comparison with the filter output signal level in order to determine whether sufficient adjacent channel energy is present to necessitate switching to the narrow bandwidth. Once a narrow bandwidth is selected, the filter output signal level can be expected to be further reduced and a second (smaller) value for the predetermined threshold is then utilized in compare block 37. Threshold 35 is connected to the output of compare block 37 for sensing which coefficient bank is selected and to select the first or second value accordingly. The first and second values employ hysteresis to avoid rapid switching back and forth of the bandwidth when the filter output signal level oscillates around the value of the threshold. Alternatively, a delay timer 41 is connected to compare block 37, so that the comparison is only performed periodically and so that bandwidth switching can only occur at predetermined intervals. In yet another alternative, a "dwell timer" can be used in which a timer is started when the bandwidth is switched. The process then continues normally except that further switching is inhibited until the dwell timer expires. The dwell time may have separate values corresponding to the direction of switching.

Figure 4:
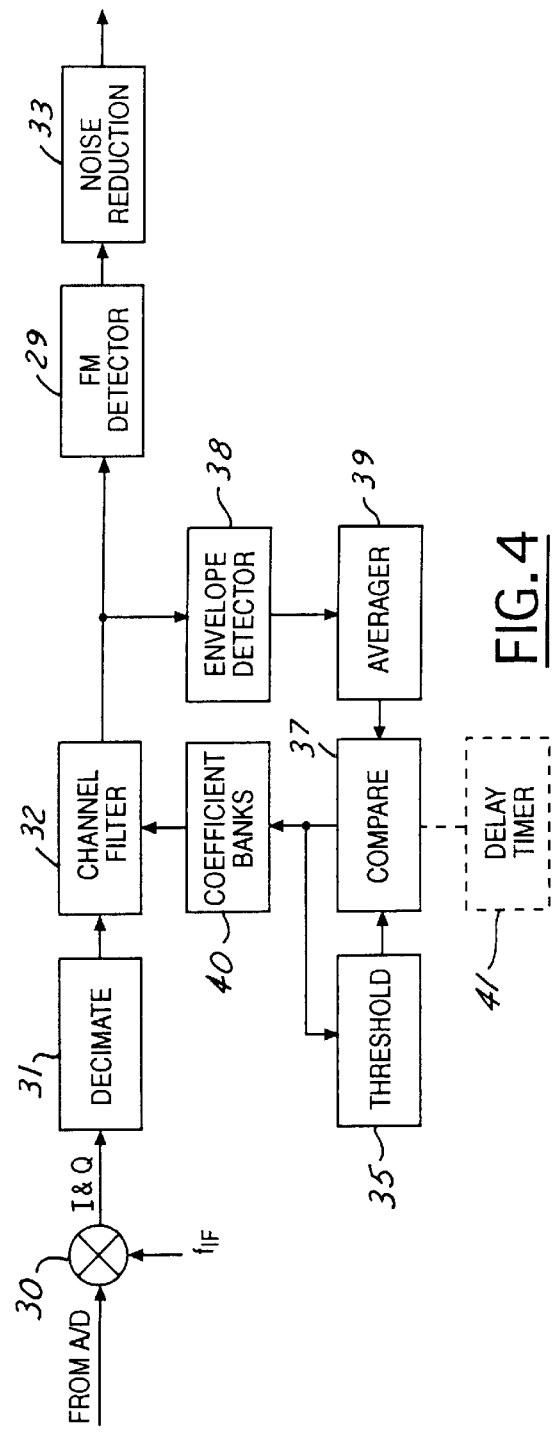
FIG. 4 is a block diagram showing DSP processing of an FM intermediate frequency signal in the manner of the present invention.

FIG. 4 shows an alternative embodiment for processing an FM-modulated IF frequency. Post-filter level detection and coefficient bank selection are similar to FIG. 3. For FM processing, an FM detector 29 is connected between channel filter 32 and noise reduction block 33.

Figure 5:
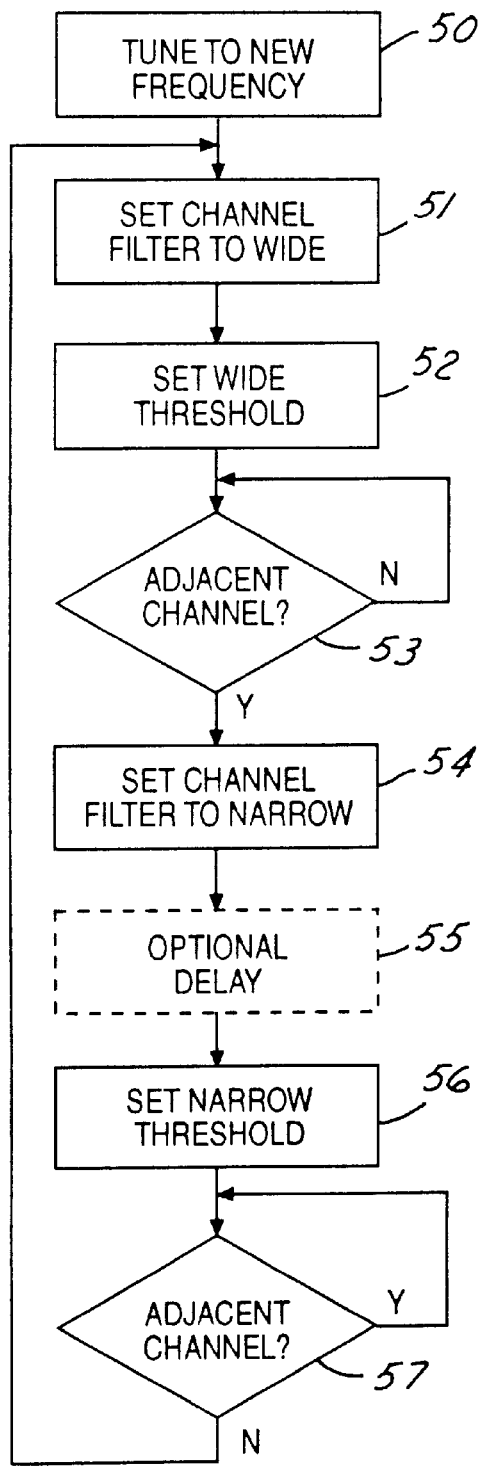
FIG. 5 is a flowchart showing a preferred method of the present invention.

The method of the present invention is shown in greater detail in FIG. 5. In step 50, the radio receiver is tuned to a new frequency. In step 51, the filter coefficient bank is selected which sets the channel filter processor to a wide bandwidth. The predetermined threshold is set to the first value corresponding to the use of the wide bandwidth filter in step 52. In step 53, a check is made for an adjacent channel interferer by comparing the first value and the signal level at the filter output. If the signal level is not greater than the first value of the threshold, then no significant interferer is currently present. No action is taken but step 53 continues to monitor for changes in the comparison.

If the filter output signal level is greater than the first value of the threshold, then an interferer is present and the bank of filter coefficients is selected in step 54 which gives the channel filter its narrower bandwidth. To avoid erratic switching of the channel filter bandwidth, an optional delay of several seconds can be executed in step 55. Alternatively, erratic switching can be avoided by using hysteresis in the different threshold values selected (i.e., a guardband is added to further separate the two threshold values).

In step 56, the threshold is set to its second value. In step 57, a check is made to detect adjacent channel interferers by comparing the filter output signal level with the narrowband, second value of the threshold. If the signal level is greater than the narrowband difference threshold, then an interferer is still present. No change is made and step 57 continues to check using the narrow filter bandwidth and second value of the threshold. If the signal level becomes less than the second value of the threshold, then the adjacent channel interferer is no longer present and a return is made to step 51 for switching the channel filter back to its wide bandwidth.

Depending upon the typical likelihood of interferers being present, general reception conditions, and the desired performance of a receiver, FIG. 5 could be easily modified to start out using a narrow bandwidth and then switching to a wide bandwidth only if interferers are not present.

Figure 6:
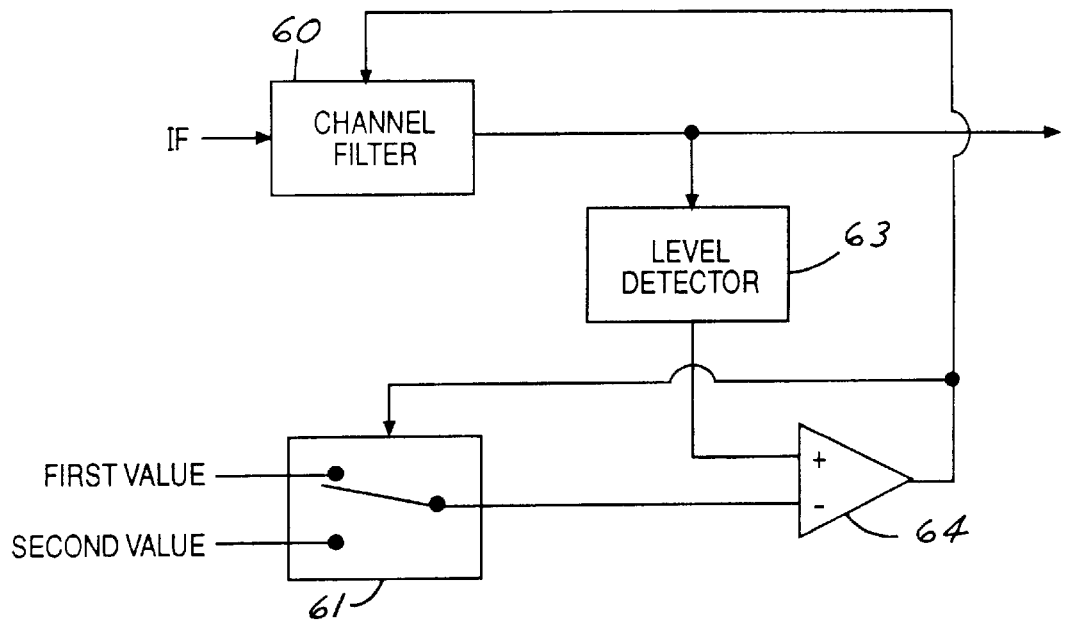
FIG. 6 is a block diagram showing the comparison function in greater detail.

Further details of the present invention are shown in FIG. 6. Channel filter 60 uses a narrow or wide passband to filter the IF signal. A multiplexer 61 selectably generates either the first value or the second value for the predetermined threshold and provides the selected value to the inverting input of a comparator 64. A post-filter level detector 63 generates a level signal responsive to the filtered IF signal and provides the level signal to the non-inverting input of comparator 64. The value of the threshold is selected in response to the output of comparator 64 which also controls coefficient bank selection of channel filter 60.

Figure 7:
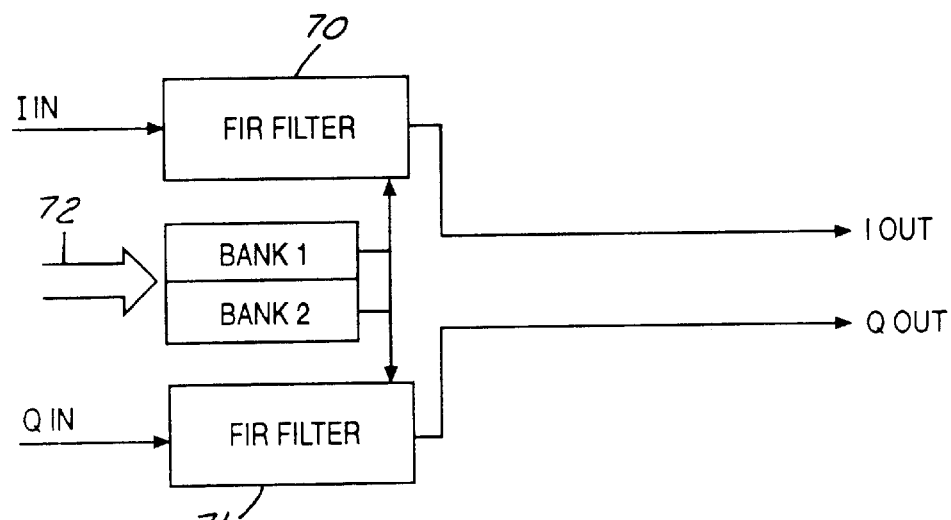
FIG. 7 is a block diagram showing a filter processor for implementing a channel filter as used in the present invention.

FIG. 7 shows a channel filter in more detail. A finite impulse response (FIR) filter or an infinite impulse response (IIR) filter can be implemented using a DSP filter processor. In particular, applicants have used an FIR filter for FM processing and an IIR filter for AM processing. In the preferred embodiments, a complex (i.e. in-phase and quadrature-phase component) signal is used to represent the IF signal. Channel filtering for the I component and the Q component is provided by separate filter elements 70 and 71, respectively. For example, each FIR filter in FIG. 7 is comprised of a multi-tapped delay line and is configured according to filter coefficients stored in coefficient banks 1 and 2. Control signals 72 are provided to the filter coefficient banks in order to selectively load either bank 1 or bank 2 into FIR filters 70 and 71. FIR filtering has the advantage that the output of the filter has greater continuity before and after changing the filter bandwidth than does an IIR filter, and so transient effects are minimized. As another means to reduce transients, it may be desirable to set all signal values in the filter to zero at the time that the filter coefficients are switched. Alternatively, the receiver output can be briefly muted at the time of switching.

In other alternative embodiments, the present invention could utilize more than two discrete bandwidths. A range of bandwidths can be obtained using a plurality of filter coefficient banks and a like plurality of threshold values that may be varied to provide hysteresis.

What is claimed is:

1. A method for digitally processing an intermediate frequency (IF) signal, comprising the steps of:

generating a carrier-based signal in an analog broadcast tuner in response to a broadcast signal from an antenna, said analog broadcast tuner applying automatic gain control to said carrier-based signal in order to provide a predetermined signal level;

digitizing said carrier-based signal;

selecting a first bank of filter coefficients for a filter processor to provide a finite impulse response with a first bandwidth;

filtering said carrier-based signal in said filter processor to generate a filtered IF signal;

generating a first level signal in response to a signal level of said filtered IF signal;

comparing said first signal level with a predetermined threshold; and selecting a second bank of filter coefficients for said filter processor to provide an impulse response with a second bandwidth narrower than said first bandwidth if said first signal level is greater than said predetermined threshold.

2. The method of claim 1 further comprising the step of:

selecting a first value for said predetermined threshold when said first bank of filter coefficients is being used.

3. The method of claim 2 further comprising the steps, after selecting said second bank of filter coefficients, of:

selecting a second value for said predetermined threshold which is relatively larger than said first value;

repeating said steps of filtering said carrier-based signal, generating said first level signal, and comparing said first level signal with said threshold; and reselecting said first bank of filter coefficients if said first level is less than said second value of said predetermined threshold.

* * * * *